US012727107B2

(12) United States Patent
Xia et al.

(10) Patent No.: US 12,727,107 B2
(45) Date of Patent: Sep. 1, 2026

(54) COMPUTING NODE AND SERVER

(71) Applicant: xFusion Digital Technologies Co., Ltd, Zhengzhou City (CN)

(72) Inventors: Weimin Xia, Zhengzhou (CN); Zhongli Ji, Zhengzhou (CN)

(73) Assignee: xFusion Digital Technologies Co., Ltd, Zhengzhou City (CN)

( * ) Notice: Subject to any disclaimer, the term of this patent is extended or adjusted under 35 U.S.C. 154(b) by 45 days.

(21) Appl. No.: 18/972,285

(22) Filed: Dec. 6, 2024

(65) Prior Publication Data

US 2025/0107030 A1 Mar. 27, 2025

Related U.S. Application Data

(63) Continuation of application No. PCT/CN2023/097948, filed on Jun. 2, 2023.

(30) Foreign Application Priority Data

Sep. 28, 2022 (CN) ......................... 202211190445.1

(51) Int. Cl.
*H05K 7/14* (2006.01)
*G06F 1/18* (2026.01)
*G06F 1/184* (2026.01)

(52) U.S. Cl.
CPC ........... *H05K 7/1487* (2013.01); *G06F 1/181* (2013.01); *G06F 1/184* (2013.01)

(58) Field of Classification Search
CPC .............................. H05K 7/1487; G06F 1/181
See application file for complete search history.

(56) References Cited

U.S. PATENT DOCUMENTS

2012/0215956 A1 8/2012 Zeng et al.
2019/0121402 A1* 4/2019 Puligundla ........... H05K 7/1422
2021/0399450 A1* 12/2021 Herring .................. H01R 12/75

FOREIGN PATENT DOCUMENTS

CN 1217494 A 5/1999
CN 114661099 A 8/2023
CN 115023075 A 11/2023

OTHER PUBLICATIONS

Extended European Search Report for the corresponding EP application No. 23869693.4, issued on Aug. 12, 2025.

* cited by examiner

*Primary Examiner* — Jerry Wu
(74) *Attorney, Agent, or Firm* — Rimon PC

(57) ABSTRACT

A computing node includes a housing, a first mainboard, a processor circuit board, and a first cable. The housing includes an accommodating cavity, and a coolant is disposed in the accommodating cavity. The processor circuit board includes a first surface, a second surface, and a first side surface. The first side surface of the processor circuit board faces the first mainboard, a processor is disposed on the first surface or the second surface of the processor circuit board, and the processor is electrically connected to the first mainboard. A plurality of first memories are disposed on the first mainboard, and a first end of the first cable is electrically connected to the first mainboard. A second end of the first cable is electrically connected to the processor circuit board. The processor is electrically connected to the plurality of first memories by using the first cable.

10 Claims, 10 Drawing Sheets

COMPUTING NODE AND SERVER

CROSS-REFERENCE TO RELATED APPLICATIONS

This application is a continuation of International Application No. PCT/CN2023/097948, filed on Jun. 2, 2023, which claims priority to Chinese Patent Application No. 202211190445.1, filed on Sep. 28, 2022. The disclosures of the aforementioned applications are hereby incorporated by reference in their entireties.

TECHNICAL FIELD

This application relates to the field of server technologies, and in particular, to a computing node and a server.

BACKGROUND

With the rise of big data, cloud computing, and artificial intelligence (AI), requirements for computing density of a server system are increasingly high.

A server system includes a cabinet body and a plurality of computing nodes. The plurality of computing nodes are disposed, at intervals, in a height direction of the cabinet body. A computing node includes a mainboard, a memory, an X Processing Unit (XPU), and a heat dissipation member. The XPU is disposed on the mainboard, and the heat dissipation member covers the XPU to dissipate heat from the XPU. The memory is inserted on a periphery of the XPU on the mainboard. As power consumption of the XPU increases, a size of the heat dissipation member on the XPU also increases. The XPU and the heat dissipation member on the XPU occupy space on the mainboard, reducing the quantity of memories that can be inserted on the mainboard.

The reduced quantity of memories in the computing node causes a low computing density of the computing node.

SUMMARY

Embodiments of this application provide a computing node and a server that allow more memories to be disposed in a space above a first mainboard, so that computing density of the computing node is increased.

According to a first aspect of the embodiments of this application, a computing node is provided, and includes a housing, a first mainboard, a processor circuit board, and a first cable. The housing includes an accommodating cavity, and a coolant is disposed in the accommodating cavity. The first mainboard, the processor circuit board, and the first cable are located in the accommodating cavity. The processor circuit board includes a first surface, a second surface, and a first side surface connected to the first surface and the second surface. The first surface and the second surface are disposed opposite to each other. The first side surface of the processor circuit board faces the first mainboard, a processor is disposed on the first surface or the second surface of the processor circuit board, and the processor is electrically connected to the first mainboard. A plurality of first memories are disposed on the first mainboard, and a first end of the first cable is electrically connected to the first mainboard. A second end of the first cable is electrically connected to the processor circuit board. The processor is electrically connected to the plurality of first memories by using the first cable.

In embodiments of this application, the housing, the first mainboard, the processor circuit board, and the first cable are disposed in the computing node. The housing includes an accommodating cavity, wherein the first mainboard, the processor circuit board, the first cable, and coolant are located in the accommodating cavity, and the coolant is configured to dissipate heat from a device in the computing node. The processor circuit board includes the first surface, the second surface, and the first side surface connected to the first surface and the second surface. The first surface and the second surface are disposed opposite to each other, the first side surface of the processor circuit board faces the first mainboard, and the processor is disposed on the first surface or the second surface of the processor circuit board This way, the processor circuit board is vertically inserted on the first mainboard, and the processor is also vertically disposed relative to the first mainboard. The plurality of first memories are disposed on the first mainboard, and the processor is electrically connected to the plurality of first memories by using the first cable. In the conventional technology, a processor is horizontally disposed on a mainboard, the processor and a heat sink or a cold plate covering the processor occupy large space in a computing node, and therefore computing density of the computing node is low. In the computing node provided in embodiments of this application, the processor circuit board is vertically inserted on the first mainboard, and the coolant is used for heat dissipation. Therefore, more first memories can be disposed in space above the first mainboard, so that computing density of the computing node is high.

In a possible implementation, in the computing node provided in the embodiments of this application, the processor circuit board further includes a first plug-connection part. The first plug-connection part is disposed on the first side surface of the processor circuit board, The first mainboard further includes a second plug-connection part, and the first plug-connection part is plug-connected to the second plug-connection part. The processor circuit board and the first mainboard are electrically connected through plug-connection between the first plug-connection part and the second plug-connection part, and the processor circuit board can be fastened to the first mainboard.

In a possible implementation, in the computing node provided in the embodiments of this application, a first connector is further disposed on the first mainboard and a second connector is further disposed on the processor circuit board. The first end of the first cable is electrically connected to the first mainboard by using the first connector, and the second end of the first cable is electrically connected to the processor circuit board by using the second connector. The first connector, the first cable, and the second connector can be arranged based on relative positions between the first memories and the first mainboard in the computing node, so that space in the computing node is fully utilized.

In a possible implementation, in the computing node provided in the embodiments of this application, the computing node further includes a second mainboard and a second cable. A plurality of second memories are disposed on the second mainboard. The processor circuit board further includes a second side surface connected to the first surface and the second surface, where the first side surface and the second side surface are disposed opposite to each other. The processor circuit board is disposed on the second mainboard, where the second side surface of the processor circuit board faces the second mainboard. A first end of the second cable is electrically connected to the second mainboard and a second end of the second cable is electrically connected to the processor circuit board. The processor is electrically connected to the plurality of second memories by using the second cable, and the plurality of first memories and the plurality of second memories are disposed in a staggered manner. The plurality of second memories are disposed on the second mainboard, so that the computing density of the computing node can be further increased.

In a possible implementation, in the computing node provided in the embodiments of this application, a third connector is further disposed on the second mainboard, and a fourth connector is further disposed on the processor circuit board. The first end of the second cable is electrically connected to the second mainboard by using the third connector, and the second end of the second cable is electrically connected to the processor circuit board by using the fourth connector. The third connector, the second cable, and the fourth connector can be arranged based on relative positions between the second memories and the second mainboard in the computing node, so that the space in the computing node is fully used.

In a possible implementation, in the computing node provided in the embodiments of this application, the computing node includes two processor circuit boards, where first surfaces of the two processor circuit boards are disposed at intervals in a same direction. A fifth connector is disposed on one of the two processor circuit boards, a sixth connector is disposed on the other of the two processor circuit boards, and processors on the two processor circuit boards are electrically connected by using the fifth connector and the sixth connector. Compared with a case in which the computing node includes one processor circuit board, more processors can be disposed on the two processor circuit boards, so that the computing density of the computing node can be further increased.

In a possible implementation, in the computing node provided in the embodiments of this application, the fifth connector and the sixth connector are wireless connectors. The wireless connectors are used to electrically connect the two processor circuit boards, so that cabling in the computing node can be reduced, and a layout in the computing node is neater.

In a possible implementation, in the computing node provided in the embodiments of this application, the computing node further includes a third cable; and the processors on the two processor circuit boards are electrically connected by using the fifth connector, the sixth connector, and the third cable. The fifth connector and the sixth connector are electrically connected by using the third cable, so that the two processor circuit boards are electrically connected more stably.

In a possible implementation, in the computing node provided in the embodiments of this application, the processor circuit board further includes a positioning member. The first mainboard includes a limiting part that fits with the positioning member, and the positioning member is inserted into the limiting part. The positioning member fits with the limiting part, so that the processor circuit board can be smoothly plug-connected to the first mainboard.

In a possible implementation, in the computing node provided in the embodiments of this application, the processor circuit board further includes a storage chip; and the storage chip is electrically connected to the processor. The storage chip is disposed on the first surface or the second surface of the processor circuit board, so that the computing density of the computing node can be further increased while the space above the first mainboard is not occupied.

According to a second aspect of the embodiments of this application, a server is provided. The server includes a cabinet body and the foregoing computing node; and the computing node is located in the cabinet body.

With reference to the accompanying drawings, these and other aspects, implementation forms, and advantages of the example embodiments will become apparent from the embodiments described below. However, it should be understood that the specification and the accompanying drawings are merely intended to describe but not limit this application. For details, refer to the appended claims. Other aspects and advantages of this application are set forth in the following description, and are partially apparent from the description, or are learned by practice of this application. In addition, aspects and advantages of this application may be implemented and obtained by means and combinations noted in the appended claims.

DESCRIPTIONS OF REFERENCE NUMERALS

Figure 1:
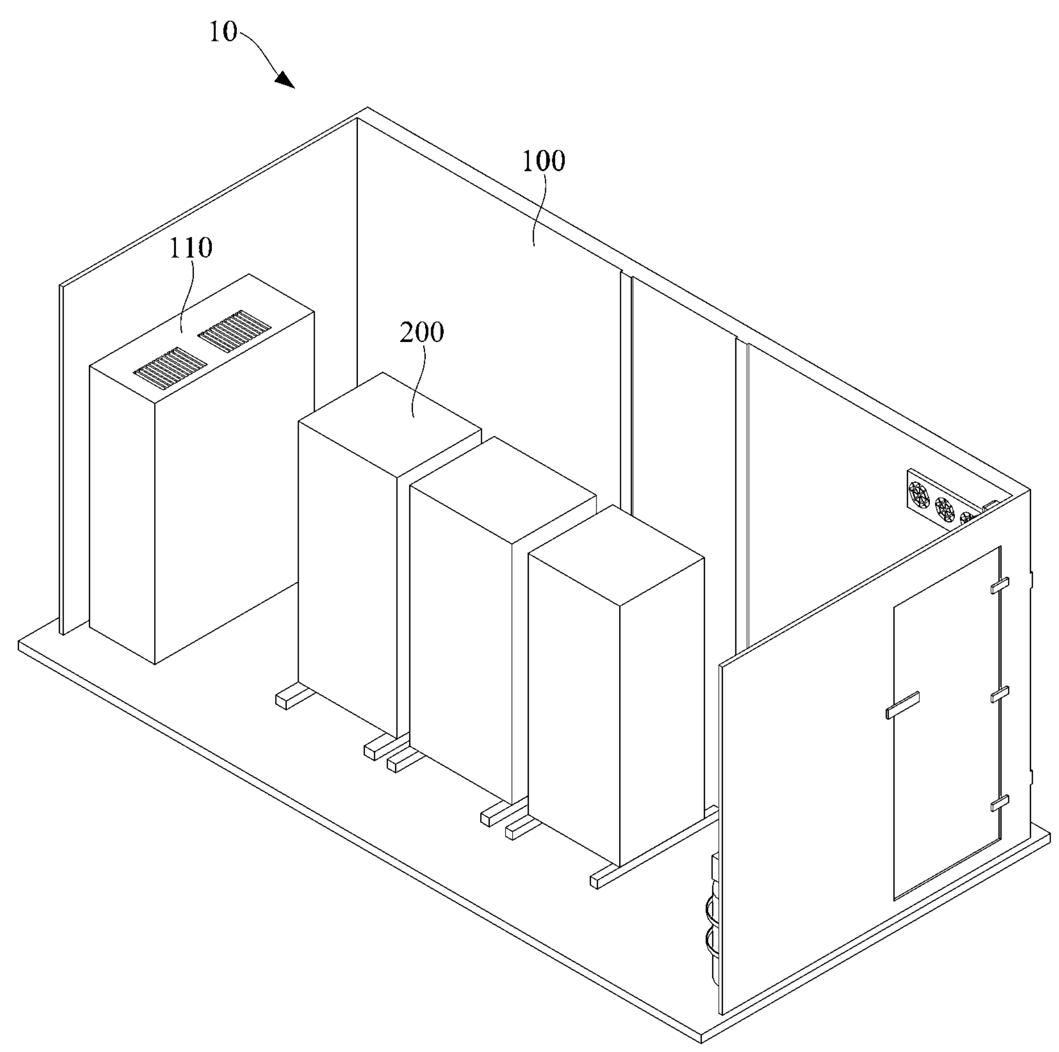
FIG. 1 is a schematic diagram of a structure of a data center according to embodiments of this application.

10—data center;

100—equipment room; 110—cooling medium distribution apparatus; 111—liquid inlet pipeline; 112—liquid outlet pipeline;

200—server;

210—cabinet body;

220*a*—computing node; 221*a*—housing; 2211*a*—accommodating cavity; 222*a*—mainboard; 223*a*—processor; 224*a*—memory; 225*a*—heat sink; 2251*a*—fin structure; 2252*a*—air duct; 226*a*—cold plate;

220—computing node; 221—housing; 2211—accommodating cavity; 2212—coolant inlet; 2213—coolant outlet; 2214—spray pipeline; 2215—spray head; 222—mainboard; 2221—first mainboard; 2222—second mainboard; 223—processor unit; 2231—processor circuit board; 2232—processor; 2233—storage chip; 2234—positioning member; 224—memory; 2241—first memory; 2242—second memory; 225—first connection unit; 2251—first cable; 2252—first connector; 2253—second connector; 2254—second cable; 2255—third connector; 2256—fourth connector; 226—second connection unit; 2261—first plug-connection part; 2261*a*—vertical insertion connector pin; 2261*b*—gold finger pin; 2262—second plug-connection part; 2263—support; 227—third connection unit; 2271—fifth connector; 2272—sixth connector; 2273—third cable;

L—first circuit;

X—first direction;

Y—second direction; and

Z—third direction.

DESCRIPTION OF EMBODIMENTS

Terms used in implementations of this application are merely used to explain embodiments of this application, and are not intended to limit this application. The following describes implementations of embodiments of this application in detail with reference to the accompanying drawings For ease of understanding, related technical terms involved in embodiments of this application are first explained and described.

Processor: a processor is a general name of various processors such as a central processing unit (CPU), a graphics processing unit (GPU), and a tensor processing unit (TPU), and is referred to as an XPU for short.

Memory: a memory is configured to temporarily store operation data in a processor and data exchanged with external storage devices such as a hard disk. The processor invokes, into the memory, data that needs to be operated on, to perform an operation. The processor transmits a result after the operation is completed.

Computing density: computing density refers to a capability and a speed of a data center in data processing. The computing density is jointly determined by a power of a processor, a quantity of processors, and a capacity of a memory, where a larger power of the processor, a larger quantity of processors, and a larger capacity of the memory, indicate a higher computing density.

Cold plate: a cold plate is a sealed heat sink that can accommodate flowing liquid, and is usually attached to a heating element by using a thermally conductive interface material, to dissipate heat from the heating element.

Liquid immersion cooling: liquid immersion cooling refers to immersing a heating electronic element into a refrigerant (coolant) to dissipate heat through liquid flowing and circulation. When liquid immersion cooling is used, the heating element is omnidirectionally in direct contact with the refrigerant. Therefore, heat dissipation efficiency of liquid immersion cooling is higher.

FIG. 1 is a schematic diagram of a structure of a data center according to embodiments of this application. A data center 10 is a globally coordinated network of devices, and is configured to transfer, accelerate, display, compute, and store data information on an Internet infrastructure. The data center 10 provided in embodiments of this application may include an equipment room 100 and at least one server 200 disposed in the equipment room 100. It may be understood that the equipment room 100 may be a closed room, or may be a room that is open on one or more sides. The equipment room 100 may be a built temporary room, for example, a tent room or a prefabricated room, or may be a built permanent room.

Either one server 200, or a plurality of servers 200, may be disposed in the equipment room 100. When a plurality of servers 200 are disposed in the equipment room 100, the servers 200 may be the same, partially the same, or different. Server 200 may be any type of server, for example, a desktop server, a blade server, a rack server, or a cabinet server.

Figure 2:
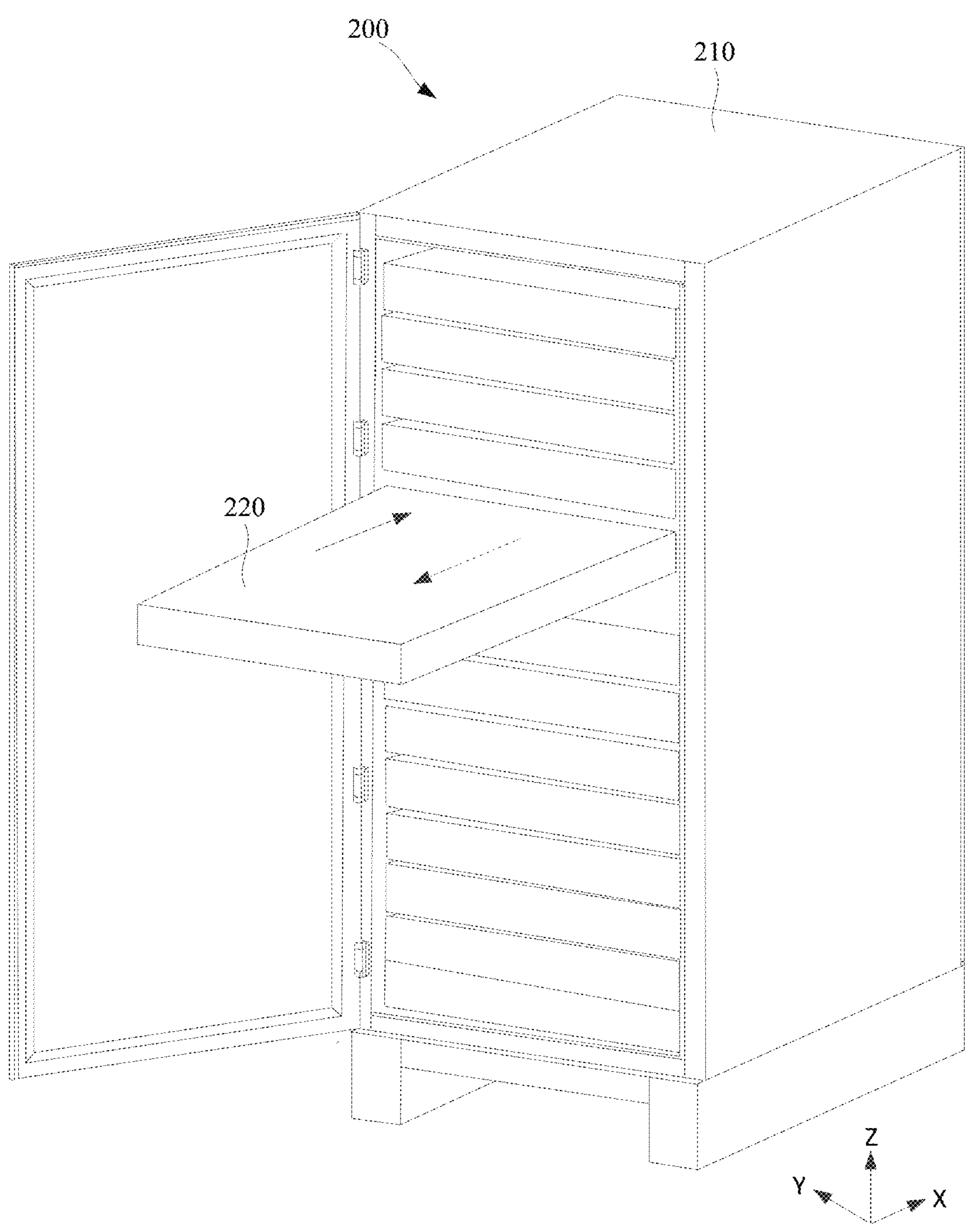
FIG. 2 is a schematic diagram of a server according to embodiments of this application.

FIG. 2 is a schematic diagram of a server according to embodiments of this application. Referring to FIG. 2, the server 200 provided in embodiments of this application may be a rack server. The server 200 includes a cabinet body 210 and a plurality of computing nodes 220, wherein the plurality of computing nodes 220 are disposed at intervals in sequence in a height direction of the cabinet body 210.

The cabinet body 210 serves as a support component of the computing node 220. Referring to FIG. 2, a width direction of the cabinet body 210 is referred to as a first direction X, a length direction of the cabinet body 210 is referred to as a second direction Y, the height direction of the cabinet body 210 is referred to as a third direction Z, and the plurality of computing nodes 220 are disposed at intervals in sequence in the cabinet body 210 in the third direction Z. A higher computing density of the computing node 220 in the server 200 indicates a higher computing density of the server 200.

Figure 3:
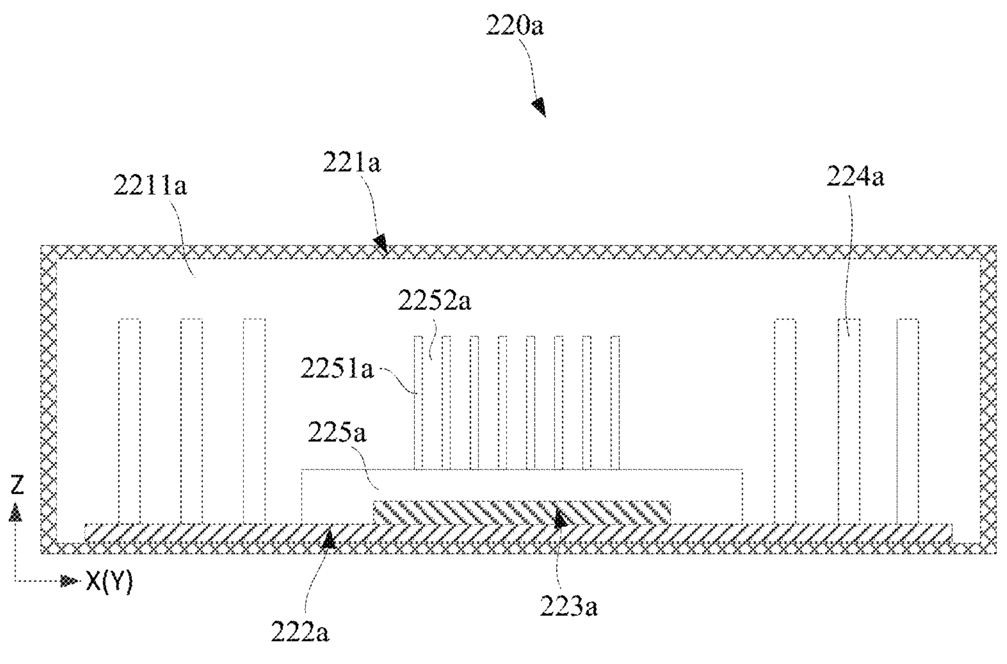
FIG. 3 is a schematic diagram of an internal structure of a computing node in a first related technology.

FIG. 3 is a schematic diagram of an internal structure of a computing node in a first related technology. The computing node is referenced as 220*a*, and components in the computing node 220*a* are suffixed with the letter 'a'. Referring to FIG. 3, the computing node 220*a* includes a housing 221*a*, a mainboard 222*a*, at least one processor 223*a*, and a plurality of memories 224*a*. The housing 221*a* includes an accommodating cavity 2211*a* that accommodates the mainboard 222*a*, the processor 223*a*, and the memories 224*a*.

The mainboard 222*a* is connected to an inner bottom wall of the housing 221*a* and is disposed in parallel with the inner bottom wall of the housing 221*a*. The processor 223*a* is horizontally disposed on the mainboard 222*a* and is electrically connected to the mainboard 222*a*. A heat sink 225*a* is disposed on the processor 223*a*, and the heat sink 225*a* is configured to dissipate heat from the processor 223*a*. A surface of the heat sink 225*a* covers the processor 223*a*. The other surface of the heat sink 225*a* has fin structures 2251*a*, and an air duct 2252*a* is formed between the fin structures 2251*a*. A plurality of memory slots may be welded on a periphery of the processor 223*a* on the mainboard 222*a*, and the memories 224*a* are plug-connected to the memory slots to be electrically connected to the mainboard 222*a*, so that the memories 224*a* are electrically connected to the processor 223*a* through wiring on the mainboard 222*a*. A fan is disposed in each computing node 220*a*, and the fan may be mounted on the mainboard 222*a*. Air blown by the fan flows along the air duct 2252*a* or a gap between the memories 224*a*, to dissipate heat emitted when the processor 223*a* and the memories 224*a* are active.

As the power of the processor 223*a* increases, a size of the processor 223*a* in a first direction X (or a second direction Y) in FIG. 3 increases, and more heat is emitted when the processor 223*a* runs. To meet heat dissipation requirements of the processor 223*a*, a size of the heat sink 225*a* in the first direction X (or the second direction Y) in FIG. 3 also increases, and the processor 223*a* and the heat sink 225*a* occupy more space on the mainboard 222*a*. In this case, space that is on the mainboard 222*a* and that is used for plug-connection of the memories 224*a* is narrowed, and a quantity of memories 224*a* decreases. A decrease in the quantity of memories 224*a* results in a decrease in a capacity of the memories 224*a* in the computing node 220*a*. Consequently, computing density of the computing node 220*a* is reduced.

Figure 4:
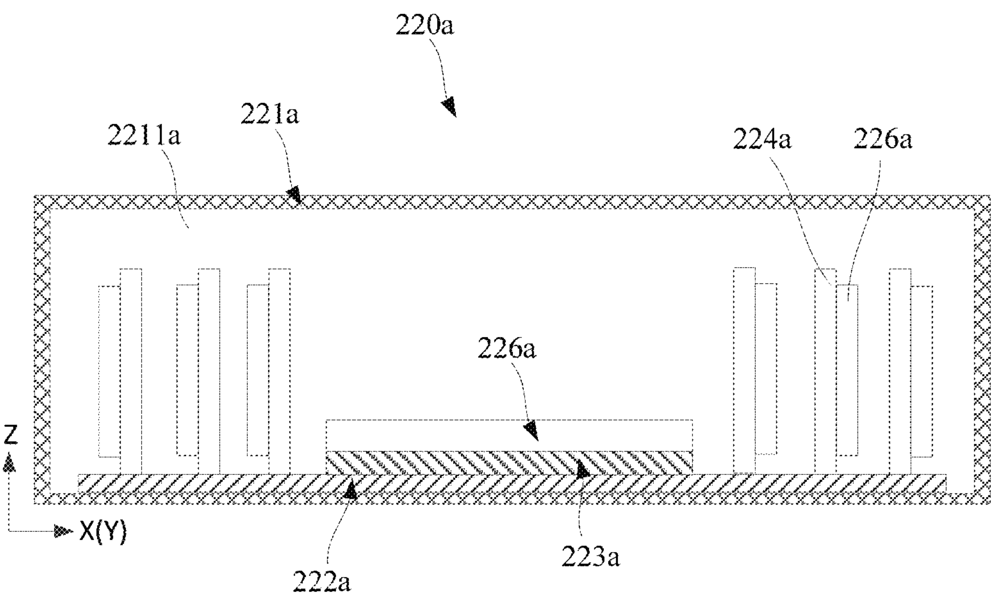
FIG. 4 is a schematic diagram of an internal structure of a computing node in a second related technology.

FIG. 4 is a schematic diagram of an internal structure of a computing node in a second related technology. Referring to FIG. 4, based on the embodiment shown in FIG. 3, the heat sink 225*a* is replaced with a cold plate 226*a*. The cold plate 226*a* covers the processor 223*a*, and dissipates, as a coolant in the cold plate 226*a* flows, heat emitted when the processor 223*a* runs. Referring to FIG. 1, a cooling medium distribution apparatus 110 is further disposed in the equipment room 100. The cooling medium distribution apparatus 110 accommodates the coolant, and there is an internal pipeline for liquid circulation in the cold plate 226*a*. The coolant in the cooling medium distribution apparatus 110 flows into the internal pipeline of the cold plate 226*a* through a communication pipeline.

The cold plate 226*a* has a better heat dissipation effect than the heat sink 225*a*, and may be used for cooling of a more powerful processor. However, the processor 223*a* and the cold plate 226*a* are also horizontally placed relative to the mainboard 222*a*, and occupy large space above the mainboard 222*a*. In this case, space that is on the mainboard 222*a* and that is used for plug-connection of the memories 224*a* is small. In addition, the cold plate 226*a* also needs to be disposed on a side surface of the memory 224*a* for heat dissipation. In this case, a gap between the memories 224*a* is enlarged, the space that is on the mainboard 222*a* and that is used for plug-connection of the memories 224*a* is further narrowed, a quantity of memories 224*a* is decreased, and computing density of the computing node 220*a* is low.

Figure 5:
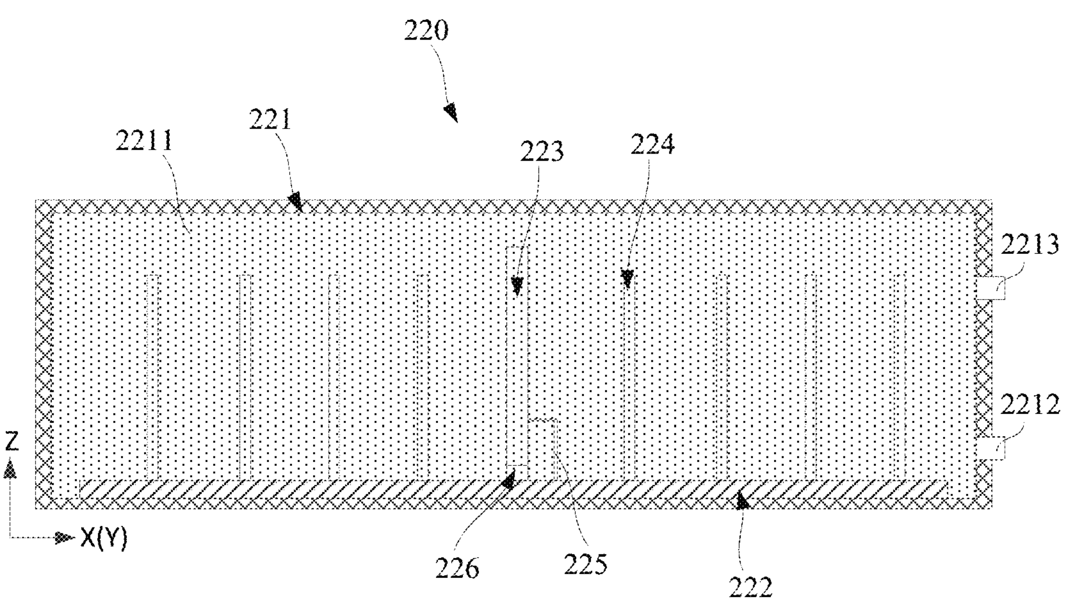
FIG. 5 is a schematic diagram of a first internal structure of a computing node according to embodiments of this application.

FIG. 5 is a schematic diagram of a first internal structure of a computing node according to embodiments of this application. In embodiments of this application, the computing node 220 includes a housing 221, at least one mainboard 222, at least one processor unit 223, and a plurality of memories 224. The housing includes an accommodating cavity 2211, and the accommodating cavity 2211 is filled with a coolant. The mainboard 222, the processor unit 223, and the memories 224 are located in the accommodating cavity 2211, the mainboard 222 is connected to an inner wall of the housing 221, and the memories 224 are plug-connected to the mainboard 222 and electrically connected to the mainboard 222. The processor unit 223 is plug-connected to the mainboard 222. The processor unit 223 is electrically connected to the mainboard 222 by using at least one first connection unit 225 and at least one second connection unit 226. The first connection unit 225 is configured to communicate a first signal, and the second connection unit 226 is configured to communicate a second signal.

The mainboard 222 may be fastened to the inner wall of the housing 221 by using a fastener, and an extension direction of the mainboard 222 is consistent with a first direction X or a second direction Y in FIG. 5. A plurality of slots are disposed on the mainboard 222. The slots are disposed in a one-to-one correspondence with the memories 224, and the memories 224 are plug-connected to the slots, to be electrically connected to the mainboard 222. There is an included angle between the memory 224 and the mainboard 222, and the included angle may vary between 20° and 90°. To facilitate plug-connection between the memory 224 and the mainboard 222, the included angle between the memory 224 and the mainboard 222 may be 90° shown in FIG. 5.

The processor unit 223 is also plug-connected to the mainboard 222. To facilitate plug-connection between the processor unit 223 and the mainboard 222, an included angle between the processor unit 223 and the mainboard may also be 90° shown in FIG. 5. In this way, the processor unit 223 and the memories 224 extend in a third direction Z, that is, the processor unit 223 is parallel to the memories 224. In this way, space above the mainboard 222 can be fully used, so that more memories 224 can be disposed above the mainboard 222, and computing density of the computing node 220 can be increased.

The processor unit 223 is a core working component for performing an operation on the computing node 220. The processor unit 223 cooperate with the memories 224 and another electronic device on the mainboard 222, and so signal communication between the processor unit 223 and the mainboard 222 needs to be implemented by using at least two connection units.

The processor unit 223 is electrically connected to the mainboard 222 by using the first connection unit 225, so that the processor unit 223 is electrically connected to the memory 224 through wiring on the mainboard 222. The first connection unit 225 is configured to communicate a first signal. The first signal may be a high-speed signal between the memory 224 and the processor unit 223. For example, the first signal may be a peripheral component interconnect express (PCIE) signal between the memory 224 and the processor unit 223. The first signal is communicated between the processor unit 223 and each memory 224 by using the first connection unit 225, so that the processor unit 223 can invoke, into the memory 224, data that needs to be operated.

The processor unit 223 is further electrically connected to the mainboard 222 by using the second connection unit 226, so that the processor unit 223 is electrically connected to another electronic device on the mainboard 222 through wiring on the mainboard 222. The second connection unit 226 is configured to communicate a second signal between the mainboard 222 and the processor unit 223, where the second signal may be a low-speed signal, for example, the second signal may be a reset signal. A reset switch is disposed on the mainboard 222, and the processor unit 223 is electrically connected to the reset switch on the mainboard 222 by using the second connection unit 226, so that reset of the processor unit 223 is controlled by the reset switch on the mainboard 222. The second signal may alternatively be a control signal or a power signal, and a communication manner of the control signal or the power signal is the same as that of the reset signal. Details are not described herein again.

The first connection unit 225 and the second connection unit 226 may be various electronic connectors. Compared with horizontal placement of the processor 223*a* and the mainboard 222*a* in the related technologies, the first connection unit 225 and the second connection unit 226 occupy smaller space above the mainboard 222. In addition, the high-speed signal and the low-speed signal are communicated through different connection units. This may facilitate fault determining.

The following describes a cooling manner of the computing node 220 in detail. Liquid immersion cooling may be used for cooling of the computing node 220. A coolant used for liquid immersion cooling is characterized by insulation, anti-corrosion, non-combustion, non-toxicity, and the like. Therefore, various devices in the computing node 220 are not damaged.

Figure 6:
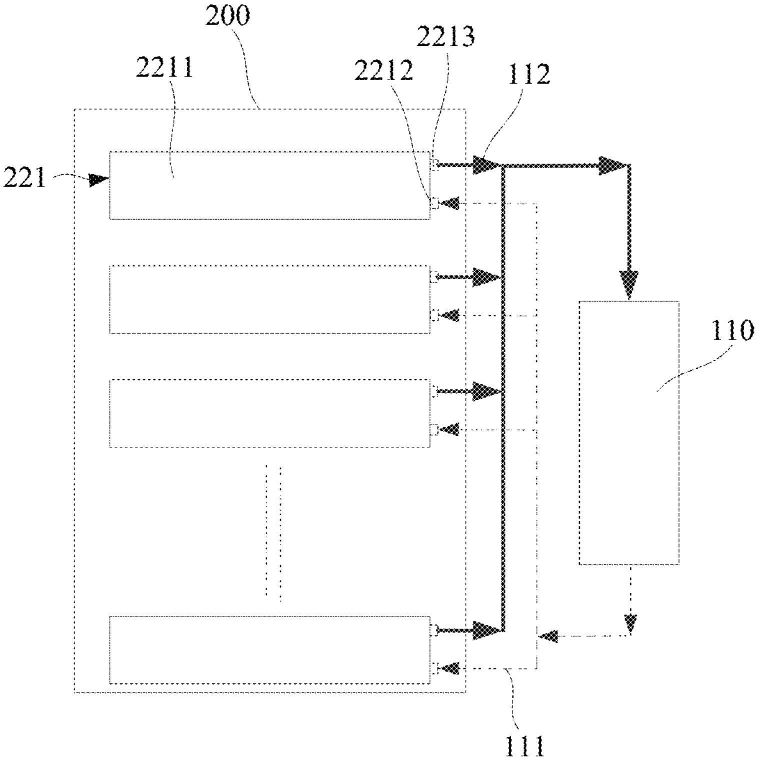
FIG. 6 is a schematic diagram of cooperation between a computing node and a cooling medium distribution apparatus according to embodiments of this application.

FIG. 6 is a schematic diagram of cooperation between a computing node and a cooling medium distribution apparatus according to embodiments of this application. Referring to FIG. 6, the cooling medium distribution apparatus 110 includes a plurality of liquid inlet pipelines 111 and a plurality of liquid outlet pipelines 112. The liquid inlet pipelines 111 are represented by dashed lines, and the liquid outlet pipelines 112 are represented by bolded solid lines. Each of the plurality of liquid inlet pipelines 111 is in communication with a coolant inlet 2212 of the housing 221, each of the plurality of liquid outlet pipelines 112 is in communication with a coolant outlet 2213 of the housing 221, and the housing 221 includes an accommodating cavity 2211 therein.

The coolant flows out of the cooling medium distribution apparatus 110, flows to the coolant inlet 2212 along each liquid inlet pipeline 111, enters the accommodating cavity 2211 of each housing 221 through the coolant inlet 2212, flows out of the accommodating cavity through the coolant outlet 2213, and flows back to the cooling medium distribution apparatus 110 along the liquid outlet pipeline 112. In this way, heat generated when each device in the computing node 220 runs is dissipated as the coolant flows. Dotted filling in FIG. 5 represents the coolant.

Figure 7:
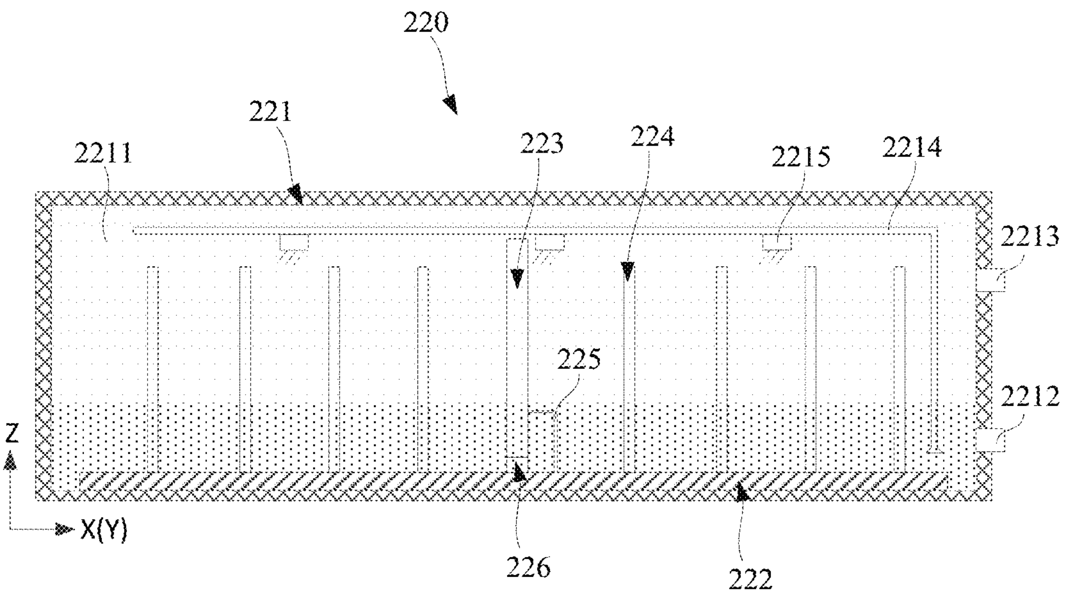
FIG. 7 is a schematic diagram of a second internal structure of a computing node according to embodiments of this application.

Liquid spray cooling may alternatively be used for cooling of the computing node 220. FIG. 7 is a schematic diagram of a second internal structure of a computing node according to embodiments of this application. Referring to FIG. 7, based on the embodiment shown in FIG. 5, a spray pipeline 2214 is further disposed in the accommodating cavity 2211 of the housing 221, a half bottom region of the accommodating cavity 2211 is filled with a coolant, one end of the spray pipeline 2214 extends into the coolant, a plurality of spray heads 2215 are disposed on the spray pipeline 2214, and positions of the spray heads 2215 may be provided based on positions of devices that require heat dissipation in the computing node 220. The coolant enters the accommodating cavity 2211 through the coolant inlet 2212. The end that is of the spray pipeline 2214 and that extends into the coolant draws the coolant, and the coolant is delivered to the spray head 2215 for spraying, to cool the device in the computing node 220. The coolant used for spray cooling may be a two-phase coolant. After cooling an electronic device in the computing node 220, the coolant absorbs heat and vaporizes, and is discharged through the coolant outlet 2213. When the coolant is a two-phase coolant, a condenser may be further disposed between the coolant outlet 2213 and the liquid outlet pipeline 112, so that the vaporized coolant is liquefied and then returned to the cooling medium distribution apparatus 110.

A cooperation manner between the computing node 220 and the cooling medium distribution apparatus 110 in spray cooling is the same as a cooperation manner between the computing node 220 and the cooling medium distribution apparatus 110 in immersion cooling. Details are not described herein again. Compared with immersion cooling, spray cooling can save more coolants, and can enable local spray to be performed on a device that needs to be cooled.

Cooling effects of liquid immersion cooling and liquid spray cooling are better than those of air-cooled heat dissipation and liquid cooling heat dissipation. Therefore, liquid immersion cooling and liquid spray cooling are applicable to the processor unit 223 with larger power. In addition, by using liquid immersion cooling or liquid spray cooling, the heat sink 225*a* or the cold plate 226*a* may not be disposed in the computing node 220, thereby saving the space above the mainboard 222. In this way, more memories 224 can be disposed above the mainboard 222, so that the computing density of the computing node 220 can be increased.

Figure 8:
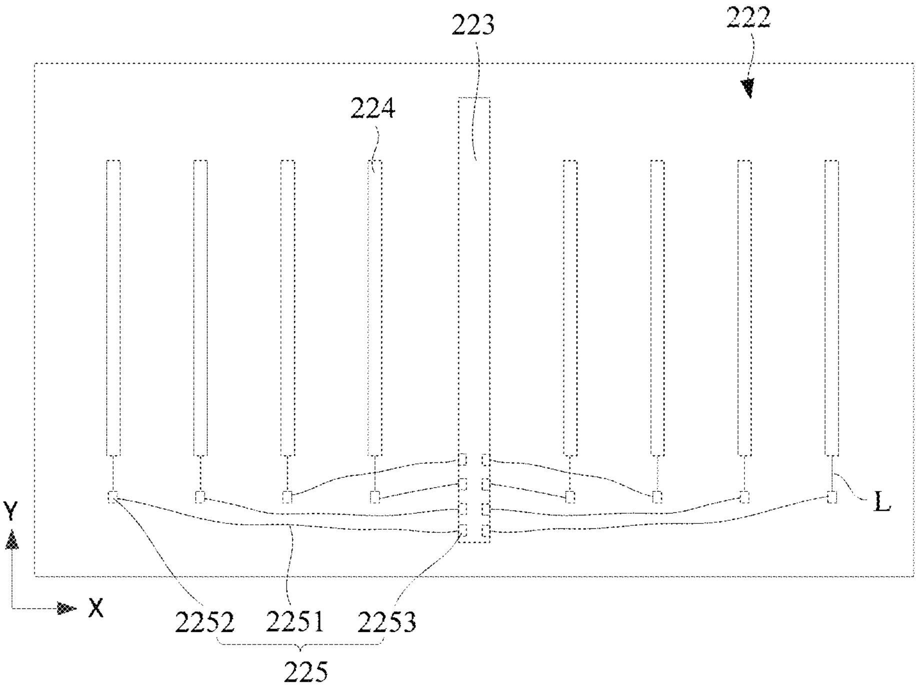
FIG. 8 is a top view of FIG. 5.

The following describes a structure of the first connection unit 225 in embodiments of this application. FIG. 8 is a top view of FIG. 5, and the housing 221 is removed for clarity. Referring to FIG. 8 and FIG. 5, the plurality of memories 224 are evenly disposed at intervals in the extension direction of the mainboard 222. The first connection units 225 are disposed in a one-to-one correspondence with the memories 224. The first connection unit 225 includes a first cable 2251 and a first connector 2252 and a second connector 2253 that are electrically connected to two ends of the first cable 2251. The first connector 2252 is disposed on the mainboard 222 and is electrically connected to the mainboard 222. The second connector 2253 is disposed on the processor unit 223 and is electrically connected to the processor unit 223.

Still referring to FIG. 8, the processor unit 223 is electrically connected to the mainboard 222 by using the first connection units 225, so that the processor unit 223 is electrically connected to the memories 224 through wiring on the mainboard 222, that is, the first connection units 225 are actually configured to electrically connect the processor unit 223 to the memories 224. Wiring that is on the mainboard 222 and that is used for electrical connection of the memory 224 is referred to as a first circuit, and the first circuit is schematically shown as L. In embodiments of this application, the first connection units 225 are disposed in a one-to-one correspondence with the memories 224, so that the processor unit 223 is electrically connected to the corresponding memories 224. The first connection unit 225 may be a mini cool edge IO (MCIO) high-speed connection unit, and the MCIO high-speed connection unit may support simultaneous communication of up to 148 channels, to meet a PCIE signal communication rate between the processor unit 223 and the memory 224.

The processor unit 223 and the plurality of memories 224 may be disposed at intervals in the first direction X, or may be disposed at intervals in the second direction Y. The following uses an example in which the processor unit 223 and the plurality of memories 224 may be disposed at intervals in the first direction X for description. In the embodiment shown in FIG. 8, the processor unit 223 and the plurality of memories 224 are disposed at intervals in the first direction X, and extend in the second direction Y. The first connector 2252 is disposed in a nearby region of each memory 224 on the mainboard 222. The first connector 2252 may be electrically connected to the mainboard 222 through welding, or may be electrically connected to the mainboard 222 through plug-connection, and each memory 224 on the mainboard 222 is electrically connected to the first connector 2252 in the nearby region of the memory 224 by using the first circuit L.

A plurality of second connectors 2253 are disposed on the processor unit 223. The second connector 2253 may be electrically connected to the processor unit 223 through welding, or may be electrically connected to the processor unit 223 through plug-connection. The first cable 2251 electrically connects the second connector 2253 on the processor unit 223 to the first connector 2252 that is on the mainboard 222 and corresponding to the memory 224, that is, may electrically connect each memory 224 to the processor unit 223.

It may be understood that positions of the second connectors 2253 on the processor unit 223 in embodiments of this application are not limiting, provided that an operator is able to make the connections and other components are not in the way.

Still referring to FIG. 5 and FIG. 8, the plurality of memories 224 are evenly disposed at intervals on two sides of the processor unit 223 in the extension direction of the mainboard 222.

The plurality of memories 224 are evenly distributed on the two sides of the processor unit 223 in the first direction X, that is, quantities of memories 224 located on the two sides of the processor unit 223 in the first direction X are similar or equal. This facilitates arrangement of the first connectors 2252 on the mainboard 222 and arrangement of the second connectors 2253 on the processor unit 223, and makes cabling of the first cable 2251 neat.

Figure 9:
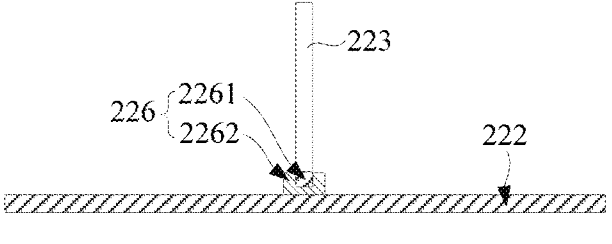
FIG. 9 is a schematic diagram of a structure of a second connection unit in a computing node according to embodiments of this application.

The following describes a structure, in embodiments of this application, of the second connection unit 226. FIG. 9 is a schematic diagram of a structure of a second connection unit in a computing node according to embodiments of this application. Referring to FIG. 9, the second connection unit 226 includes a first plug-connection part 2261 and a second plug-connection part 2262 that fits with the first plug-connection part 2261. The first plug-connection part 2261 is disposed on the processor unit 223, the second plug-connection part 2262 is disposed on the mainboard 222, and the first plug-connection part 2261 is plug-connected to the second plug-connection part 2262, so that the processor unit 223 is electrically connected to the mainboard 222.

The first plug-connection part 2261 is disposed at one end that is of the processor unit 223 and that faces the mainboard 222, and the first plug-connection part 2261 may be a plug electrically connected to the processor unit 223. The second plug-connection part 2262 is disposed on the mainboard 222, and the second plug-connection part 2262 may be a socket electrically connected to the mainboard 222. The plug is plug-connected to the socket, so that the first plug-connection part 2261 is electrically connected to the second plug-connection part 2262, and the processor unit 223 is electrically connected to the mainboard 222. Alternatively, the first plug-connection part 2261 may be a socket, and the second plug-connection part 2262 may be a plug.

It may be understood that, in addition to electrically connecting the processor unit 223 to the mainboard 222, the second connection unit 226 may further fasten the processor unit 223 to the mainboard 222.

Figure 10:
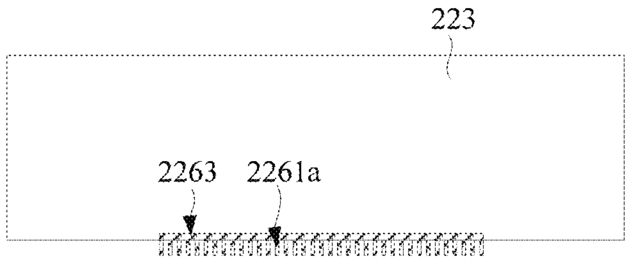
FIG. 10 is a first schematic diagram of a relative position between a first plug-connection part and a processor unit in a computing node according to embodiments of this application.

FIG. 10 is a first schematic diagram of a relative position between a first plug-connection part and a processor unit in a computing node according to embodiments of this application. Referring to FIG. 10, the second connection unit 226 may be a vertical insertion connector, one of the first plug-connection part 2261 and the second plug-connection part 2262 is vertical insertion connector pins, and the other of the first plug-connection part 2261 and the second plug-connection part 2262 is a vertical insertion connector socket.

In FIG. 10, the second connection unit 226 further includes a support 2263. The first plug-connection part 2261 is vertical insertion connector pins 2261*a*, the vertical insertion connector pins 2261*a* are fastened to the processor unit 223 by using the support 2263, and the vertical insertion connector pins 2261*a* extend out of an edge of the processor unit 223. The second plug-connection part 2262 is a vertical insertion connector socket, and the vertical insertion connector socket has jacks in a one-to-one correspondence with the vertical insertion connector pins 2261*a*. The vertical insertion connector pins 2261*a* are inserted into the jacks, to implement electrical connection and fastening between the mainboard 222 and the processor unit 223.

Figure 11:
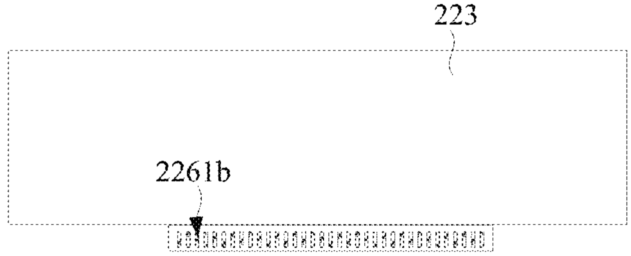
FIG. 11 is a second schematic diagram of a relative position between a first plug-connection part and a processor unit in a computing node according to embodiments of this application.

FIG. 11 is a second schematic diagram of a relative position between a first plug-connection part and a processor unit in a computing node according to embodiments of this application. Referring to FIG. 11, the mainboard 222 and the processor unit 223 may alternatively be connected by using a gold finger. One of the first plug-connection part 2261 and the second plug-connection part 2262 is gold finger pins, and the other of the first plug-connection part 2261 and the second plug-connection part 2262 is a gold finger socket.

Still referring to FIG. 11, the first plug-connection part 2261 is gold finger pins 2261*b*, and the gold finger pins 2261*b* are located on a board surface of the processor unit 223. The second plug-connection part 2262 is a gold finger socket, and the gold finger socket has contact pieces in a one-to-one correspondence with the gold finger pins 2261*b*. The gold finger pins 2261*b* are inserted into the gold finger socket to be in contact with the contact pieces, to implement electrical connection and fastening between the mainboard 222 and the processor unit 223. The gold finger pins 2261*b* may be directly formed on a surface of the processor unit 223. Therefore, compared with fastening the vertical insertion connector pins 2261*a* to the processor unit 223 by using the support 2263, higher reliability is implemented by using the gold finger pins 2261*b* for connection, and a technological process is simpler.

Figure 12:
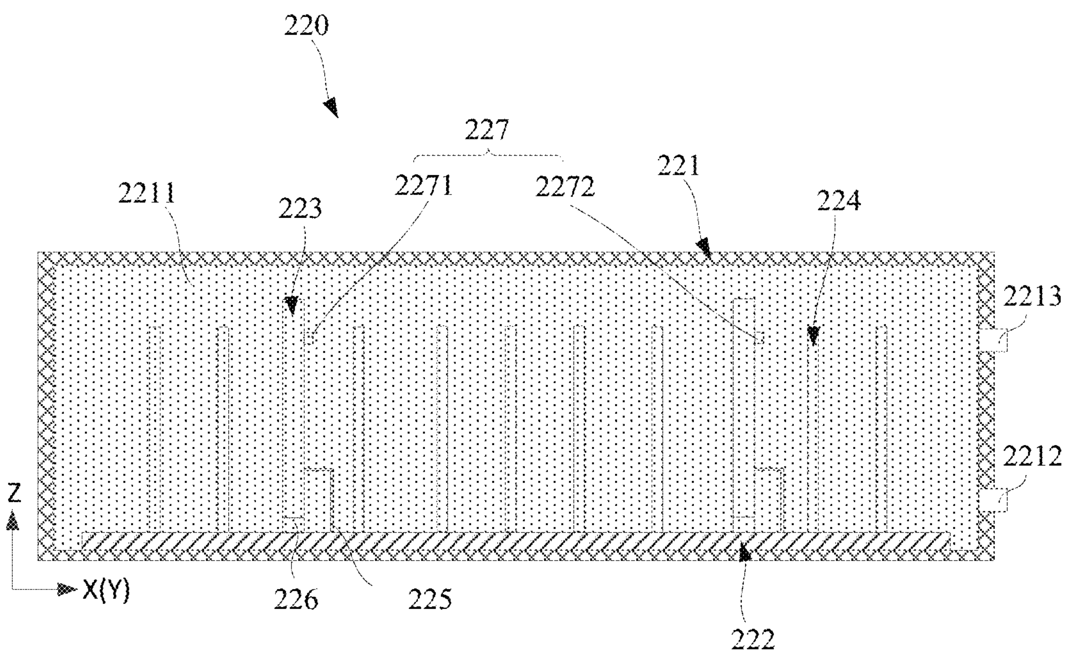
FIG. 12 is a schematic diagram of a third internal structure of a computing node according to embodiments of this application.

FIG. 12 is a schematic diagram of a third internal structure of a computing node according to embodiments of this application. Referring to FIG. 12, based on the embodiment shown in FIG. 5, to further increase the computing density of the computing node 220, there are at least two processor units 223, and the processor units 223 are electrically connected by using a third connection unit 227, to communicate a third signal. The third signal may be an ultra path interconnect (UPI) signal between the processor units 223.

Still referring to FIG. 12, the third connection unit 227 includes a fifth connector 2271 and a sixth connector 2272. The fifth connector 2271 is disposed on one of the processor units 223 and is electrically connected to the processor unit 223, and the sixth connector 2272 is disposed on the other of the processor units 223 and is electrically connected to the processor unit 223. The third connection unit 227 may be a wireless connection unit, one of the fifth connector 2271 and the sixth connector 2272 serves as a signal transmitter, and the other of the fifth connector 2271 and the sixth connector 2272 serves as a signal receiver, to implement signal communication between the processor units 223. Cabling in the computing node 220 can be reduced through wireless connection, so that a layout in the computing node 220 is neater.

Figure 13:
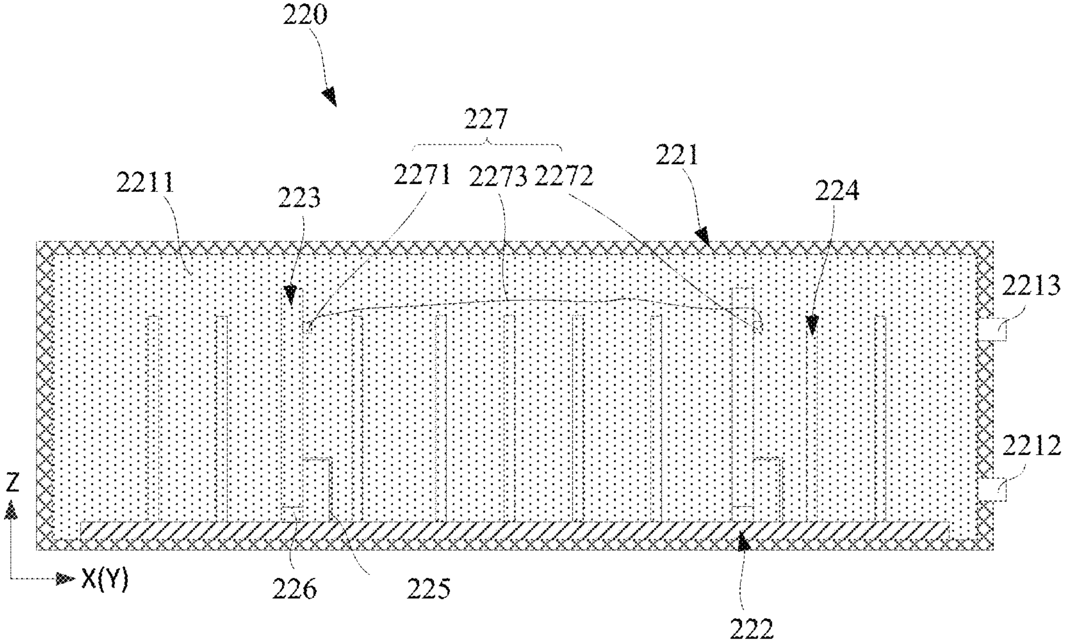
FIG. 13 is a schematic diagram of a fourth internal structure of a computing node according to embodiments of this application.

The third connection unit 227 may alternatively be a wired connection unit. FIG. 13 is a schematic diagram of a fourth internal structure of a computing node according to embodiments of this application. Referring to FIG. 13, the third connection unit 227 further includes a third cable 2273, one end of the third cable 2273 is electrically connected to the fifth connector 2271, and the other end of the third cable 2273 is electrically connected to the sixth connector 2272, so that the two processor units 223 are electrically connected. The third connection unit 227 may also be an MCIO high-speed connection unit, to meet a UPI signal communication rate between the processor units 223.

The following describes a structure of the processor unit 223 in embodiments of this application.

Figure 14:
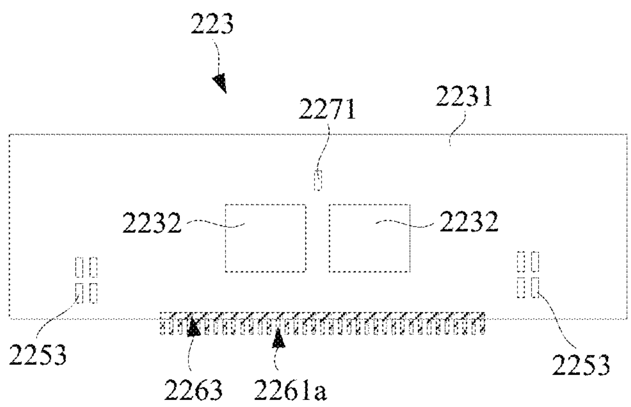
FIG. 14 is a schematic diagram of a first structure of a processor unit in a computing node according to embodiments of this application.

FIG. 14 is a schematic diagram of a first structure of a processor unit in a computing node according to embodiments of this application. The first plug-connection part 2261 on the processor unit 223 may be vertical insertion connector pins, or may be gold finger pins. In the embodiment shown in FIG. 14, the vertical insertion connector pins are used as the first plug-connection part 2261 for description.

Referring to FIG. 14, the processor unit 223 includes a processor circuit board 2231 and at least one processor 2232. The processor circuit board 2231 is inserted on the mainboard 222. The processor 2232 is attached to a side surface of the processor circuit board 2231, and is electrically connected to the processor circuit board 2231. The second connectors 2253, the fifth connector 2271 (or the sixth connector 2272), and the first plug-connection part 2261 are located on the processor circuit board 2231.

The processor 2232 is usually a device packaged by a ball grid array (BGA). Therefore, the processor 2232 cannot be vertically plug-connected to the mainboard 222 directly. The processor circuit board 2231 is configured to support the processor 2232. The processor 2232 may be welded to the processor circuit board 2231 by using a solder ball array at a bottom of the processor 2232, and may be electrically connected to the processor circuit board 2231. When the processor circuit board 2231 is vertically plug-connected to the mainboard 222, the processor 2232 is located on the side surface of the processor circuit board 2231. Therefore, the processor 2232 is also perpendicular to the mainboard 222. Compared with the case in which the processor 223*a* is horizontally disposed on the mainboard 222*a* in the related technologies, the manner of disposing the processor 2232 in embodiments of this application can save the space above the mainboard 222.

One processor 2232, or two or more processors 2232, may be disposed on the processor circuit board 2231, which is set based on the computing density of the computing node 220. When two processors 2232 are disposed on the processor circuit board 2231, the two processors 2232 are disposed at intervals on a board surface of the processor circuit board 2231. That is, when the processor circuit board 2231 is vertically plug-connected to the mainboard 222, the two processors 2232 are located on the side surface of the processor circuit board 2231, and the processors 2232 do not occupy the space above the mainboard 222.

The first plug-connection part 2261 is disposed on an edge of an end that is of the processor circuit board 2231 and that faces the mainboard 222, and the first plug-connection part 2261 is plug-connected to the second plug-connection part 2262 on the mainboard 222, to electrically connect the processor circuit board 2231 to the mainboard 222.

Still referring to FIG. 14, the second connectors 2253 and the fifth connector 2271 (or the sixth connector 2272) are disposed on the processor circuit board 2231. Specific positions of the second connectors 2253 and the fifth connector 2271 (or the sixth connector 2272) on the processor circuit board 2231 are not limited in this application, provided that they are not in the way of another device.

Figure 15:
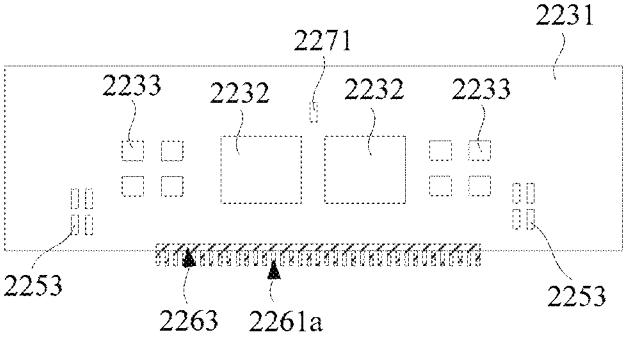
FIG. 15 is a schematic diagram of a second structure of a processor unit in a computing node according to embodiments of this application.

FIG. 15 is a schematic diagram of a second structure of a processor unit in a computing node according to embodiments of this application. Referring to FIG. 15, based on the embodiment shown in FIG. 14, the processor unit 223 further includes at least one storage chip 2233, and the storage chip 2233 is attached to the side surface of the processor circuit board 2231, and is electrically connected to the processor circuit board 2231.

The storage chip 2233 may also be a device packaged by a BGA. The storage chip 2233 is welded to the processor circuit board 2231 by using a solder ball array at a bottom of the storage chip 2233, and is electrically connected to the processor circuit board 2231, so that the storage chip 2233 is electrically connected to the processor 2232 through wiring on the processor circuit board 2231. The storage chip 2233 has the same function as the memory 224, and is configured to temporarily store operation data in the processor 2232. The processor unit 223 may include one storage chip 2233, or may include two or more storage chips 2233, which is set based on the computing density of the computing node 220.

When the processor circuit board 2231 is vertically plug-connected to the mainboard 222, the storage chip 2233 is located on the side surface of the processor circuit board 2231. Therefore, the storage chip 2233 can further increase the computing density of the computing node 220 without occupying the space above the mainboard 222.

Figure 16:
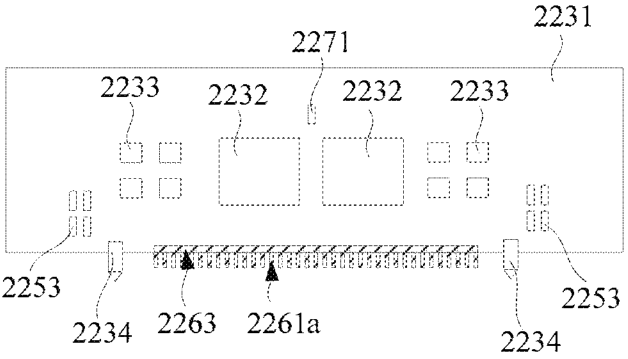
FIG. 16 is a schematic diagram of a third structure of a processor unit in a computing node according to embodiments of this application.

FIG. 16 is a schematic diagram of a third structure of a processor unit in a computing node according to embodiments of this application. Referring to FIG. 16, based on the embodiment shown in FIG. 14 or FIG. 15, the processor circuit board 2231 has at least one positioning member 2234, the mainboard 222 has a limiting part that fits with the positioning member 2234, and the positioning member 2234 is inserted into the limiting part.

The positioning member 2234 may be a guide pin welded to an edge of the processor circuit board 2231, the guide pin and the first plug-connection part 2261 are located on a same side of the processor circuit board 2231, and a length of a tip that is of the guide pin and that extends out of the edge of the processor circuit board 2231 is greater than a length of a part that is of the first plug-connection part 2261 and that extends out of the edge of the circuit board. The limiting part on the mainboard 222 may be a limiting hole on the mainboard 222, and limiting holes are disposed in a one-to-one correspondence with guide pins. When the processor circuit board 2231 is plug-connected to the mainboard 222, the tip of the guide pin is inserted into the limiting hole on the mainboard 222, and the processor limits a relative position between the processor circuit board 2231 and the mainboard 222 by using the guide pin and the limiting hole, so that the processor circuit board 2231 is smoothly plug-connected to the mainboard 222.

Two mainboards 222 may alternatively be disposed in the computing node 220. Compared with the embodiment in which the computing node 220 includes one mainboard 222, more memories 224 can be inserted on the two mainboards 222, so that the computing density of the computing node 220 can be further increased.

Figure 17:
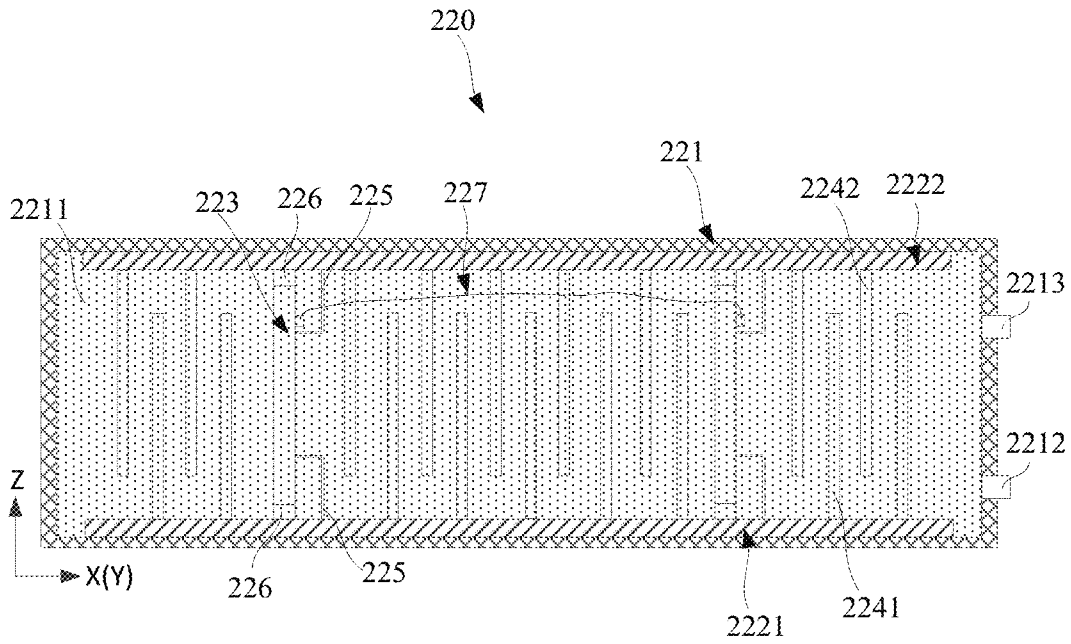
FIG. 17 is a schematic diagram of a fifth internal structure of a computing node according to embodiments of this application.

FIG. 17 is a schematic diagram of a fifth internal structure of a computing node according to embodiments of this application. Referring to FIG. 17, there are two mainboards 222, the two mainboards 222 are disposed opposite to each other, and the processor unit 223 is connected between the two mainboards 222.

Still referring to FIG. 17, one of the mainboards 222 is fastened to a bottom wall of the housing 221, and is referred to as a first mainboard 2221; and the other mainboard 222 is fastened to a top wall of the housing 221, and is referred to as a second mainboard 2222. The processor unit 223 is disposed between the first mainboard 2221 and the second mainboard 2222, and both the first mainboard 2221 and the second mainboard 2222 are electrically connected to the processor unit 223.

Figure 18:
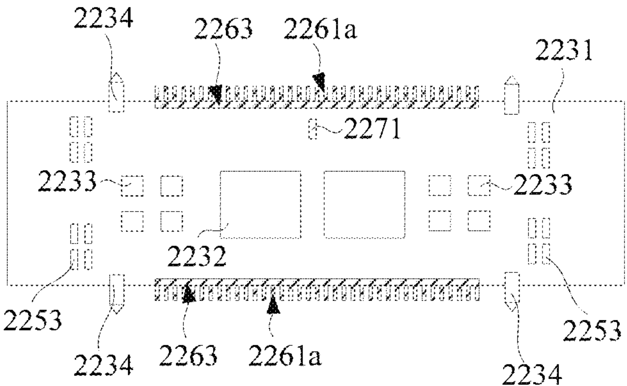
FIG. 18 is a schematic diagram of a fourth structure of a processor unit in a computing node according to embodiments of this application.

FIG. 18 is a schematic diagram of a fourth structure of a processor unit in a computing node according to embodiments of this application. Referring to FIG. 18, based on the embodiment shown in FIG. 16, two opposite ends of the processor circuit board 2231 each have a first plug-connection part 2261, and the first mainboard 2221 and the second mainboard 2222 each have a second plug-connection part 2262. The first plug-connection parts 2261 at the two ends of the processor unit 223 are respectively inserted into the second plug-connection parts 2262 on the first mainboard 2221 and the second mainboard 2222, so that the processor unit 223 is fastened and electrically connected to the first mainboard 2221 and the second mainboard 2222.

In addition, the two opposite ends of the processor unit 223 each have at least one positioning member 2234, and the first mainboard 2221 and the second mainboard 2222 each have a limiting part. A connection process of the positioning member 2234 and the limiting part is the same as that in the embodiment shown in FIG. 15. Details are not described herein again.

Still referring to FIG. 17, each mainboard 222 is connected to at least one memory 224. The memory 224 is disposed on a surface that is of one mainboard 222 and that faces the other mainboard 222, and memories 224 located on different mainboards 222 are disposed in a staggered manner.

In some embodiments the first mainboard 2221 and the second mainboard 2222 are plug-connected to a memory 224. The memory 224 inserted on the first mainboard 2221 is referred to as a first memory 2241, and the memory 224 inserted on the second mainboard 2222 is referred to as a second memory 2242. To reduce a size of the computing node 220 in the third direction Z, the first memory 2241 extends toward the second memory 2242, and the first memory 2241 and the second memory 2242 need to avoid each other.

Figure 19:
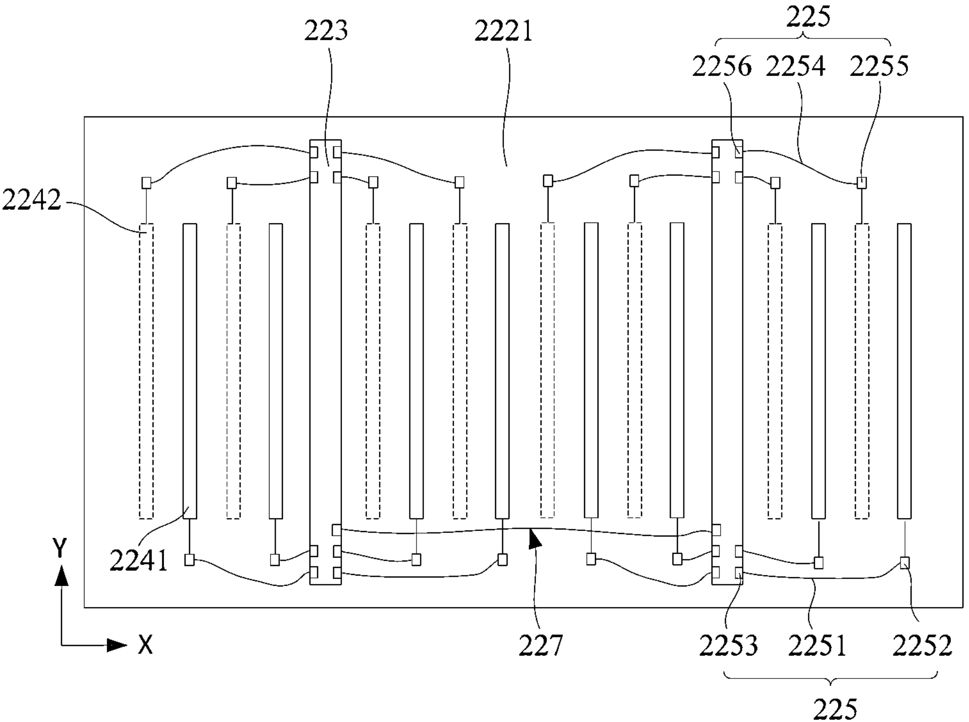
FIG. 19 is a top view of FIG. 17.

FIG. 19 is a top view of FIG. 17. For clarity, the second mainboard 2222 is removed, and the second memory 2242 electrically connected to the second mainboard 2222 is represented by a dashed line. Referring to FIG. 17 and FIG. 19, the first memory 2241 is electrically connected to the processor unit 223 by using the first connection unit 225, and the second memory 2242 is also connected to the processor unit 223 by using the first connection unit 225. The first connection unit 225 further includes a second cable 2254, a third connector 2255, and a fourth connector 2256. The third connector 2255 is disposed on the second mainboard 2222 and is electrically connected to the second mainboard 2222, and the fourth connector 2256 is disposed on the processor circuit board 2231 and is electrically connected to the processor circuit board 2231. One end of the second cable 2254 is electrically connected to the third connector 2255, and the other end of the second cable 2254 is electrically connected to the fourth connector 2256, so that the second memory 2242 is electrically connected to the second mainboard 2222. A manner of disposing the third connector 2255 and the fourth connector 2256 is the same as that in the embodiment shown in FIG. 8. Details are not described herein again.

Still referring to FIG. 17 and FIG. 19, there are an even quantity of memories 224, so that quantities of memories 224 on the mainboards 222 are equal. That is, a quantity of first memories 2241 is equal to a quantity of second memories 2242, so that the first memories 2241 and the second memories 2242 can be disposed in a staggered manner. In this way, space between the first mainboard 2221 and the second mainboard 2222 can be fully used.

In the descriptions of the embodiments of this application, it should be noted that, unless otherwise specified or limited, terms "mount", "communicate", and "connect" shall be understood in a broad sense, for example, may be a fixed connection, may be an indirect connection implemented by using an intermediate medium, or may be communication between two elements or an interaction relationship between two elements. A person of ordinary skill in the art may understand the meanings of the foregoing terms in the embodiments of this application.

In the specification, claims, and accompanying drawings of the embodiments of this application, the terms "first", "second", "third", "fourth", and the like (if any) are intended to distinguish between similar objects but do not necessarily indicate a specific order or sequence.

Finally, it should be noted that the foregoing embodiments are merely intended for describing the technical solutions of the embodiments of this application, instead of limiting the embodiments of this application. Although the embodiments of this application are described in detail with reference to the foregoing embodiments, a person of ordinary skill in the art should understand that modifications may still be made to the technical solutions described in the foregoing embodiments or equivalent replacements may still be made to some or all technical features thereof. However, these modifications or replacements do not make the essence of the corresponding technical solutions depart from the scope of the technical solutions in the embodiments of this application.

What is claimed is:

1. A computing node, comprising a housing, a first mainboard, a processor circuit board, and a first cable, wherein the housing comprises an accommodating cavity, wherein the first mainboard, the processor circuit board, the first cable and a coolant are disposed in the accommodating cavity; the processor circuit board comprises a first surface, a second surface, and a first side surface connected to the first surface and the second surface, where the first surface and the second surface are disposed opposite to each other, the first side surface of the processor circuit board faces the first mainboard, a processor is disposed on the first surface or the second surface of the processor circuit board, and the processor is electrically connected to the first mainboard; and a plurality of first memories are disposed on the first mainboard, a first end of the first cable is electrically connected to the first mainboard, a second end of the first cable is electrically connected to the processor circuit board, and the processor is electrically connected to the plurality of first memories by using the first cable; and the computing node further comprises a second mainboard and a second cable, and a plurality of second memories are disposed on the second mainboard; the processor circuit board further comprises a second side surface connected to the first surface and the second surface, and the first side surface and the second side surface are disposed opposite to each other; the processor circuit board is disposed on the second mainboard, and the second side surface of the processor circuit board faces the second mainboard; a first end of the second cable is electrically connected to the second mainboard, and a second end of the second cable is electrically connected to the processor circuit board; the processor is electrically connected to the plurality of second memories by using the second cable; and the plurality of first memories and the plurality of second memories are disposed in a staggered manner; and a third connector is further disposed on the second mainboard; a fourth connector is further disposed on the processor circuit board; the first end of the second cable is electrically connected to the second mainboard by using the third connector; and the second end of the second cable is electrically connected to the processor circuit board by using the fourth connector.

2. The computing node according to claim 1, wherein the processor circuit board further comprises a first plug-connection part, the first plug-connection part is disposed on the first side surface of the processor circuit board, and the first mainboard further comprises a second plug-connection part; and the first plug-connection part is plug-connected into the second plug-connection part.

3. The computing node according to claim 1, wherein a first connector is further disposed on the first mainboard, and a second connector is further disposed on the processor circuit board; and the first end of the first cable is electrically connected to the first mainboard by using the first connector, and the second end of the first cable is electrically connected to the processor circuit board by using the second connector.

4. The computing node according to claim 1, wherein the computing node comprises two processor circuit boards;

first surfaces of the two processor circuit boards are disposed at intervals in a same direction;

a fifth connector is disposed on one of the two processor circuit boards;

a sixth connector is disposed on the other of the two processor circuit boards; and processors on the two processor circuit boards are electrically connected by using the fifth connector and the sixth connector.

5. The computing node according to claim 4, wherein the fifth connector and the sixth connector are wireless connectors.

6. The computing node according to claim 4, wherein the computing node further comprises a third cable; and the processors on the two processor circuit boards are electrically connected by using the fifth connector, the sixth connector, and the third cable.

7. The computing node according to claim 1, wherein the processor circuit board further comprises a positioning member;

the first mainboard comprises a limiting part that fits with the positioning member; and the positioning member is inserted into the limiting part.

8. The computing node according to claim 1, wherein the processor circuit board further comprises a storage chip; and the storage chip is electrically connected to the processor.

9. The computing node according to claim 1, wherein the first mainboard is fastened to a bottom wall of the housing; and the second mainboard is fastened to a top wall of the housing.

10. A server, wherein the server comprises a cabinet body and the computing node according to claim 1, and the computing node is located in the cabinet body.

* * * * *